United States Patent
Fan et al.

(10) Patent No.: US 12,310,140 B2
(45) Date of Patent: May 20, 2025

(54) IMAGE SENSOR AND METHOD FOR FABRICATING SAME

(71) Applicant: OMNIVISION SEMICONDUCTOR (SHANGHAI) CO., LTD., Shanghai (CN)

(72) Inventors: Chun-Sheng Fan, Hsinchu (TW); Cheng Hu, Shanghai (CN)

(73) Assignee: OMNIVISION SEMICONDUCTOR (SHANGHAI) CO., LTD., Shanghai (CN)

( * ) Notice: Subject to any disclaimer, the term of this patent is extended or adjusted under 35 U.S.C. 154(b) by 464 days.

(21) Appl. No.: 17/931,349

(22) Filed: Sep. 12, 2022

(65) Prior Publication Data

US 2024/0038812 A1  Feb. 1, 2024

(30) Foreign Application Priority Data

Jul. 26, 2022 (CN) .......................... 202210887391.8

(51) Int. Cl.
*H10F 39/00* (2025.01)

(52) U.S. Cl.
CPC ......... *H10F 39/811* (2025.01); *H10F 39/024* (2025.01); *H10F 39/8053* (2025.01); *H10F 39/8063* (2025.01)

(58) Field of Classification Search
CPC .............. H10F 39/811; H10F 39/8063; H10F 39/8053; H10F 39/024
See application file for complete search history.

(56) References Cited

U.S. PATENT DOCUMENTS

| | | | |
|---|---|---|---|
| 2013/0167621 A1* | 7/2013 | Lin | B01L 3/502792 73/61.41 |
| 2021/0026164 A1 | 1/2021 | Skorka et al. | |
| 2022/0026386 A1* | 1/2022 | Lorenz Marckmann | G01N 33/492 |

FOREIGN PATENT DOCUMENTS

| | | |
|---|---|---|
| CN | 101325206 A | 12/2008 |
| CN | 101769918 A | 7/2010 |
| CN | 102231384 A | 11/2011 |
| CN | 108780800 A | 11/2018 |
| CN | 209707523 U | 11/2019 |
| CN | 212182328 U | 12/2020 |
| CN | 113406011 A | 9/2021 |
| CN | 113534547 A | 10/2021 |
| CN | 113874763 A | 12/2021 |

(Continued)

*Primary Examiner* — Anne M Hines
(74) *Attorney, Agent, or Firm* — Womble Bond Dickinson (US) LLP

(57) ABSTRACT

An image sensor and method for fabricating are provided. The image sensor includes: a semiconductor substrate with multiple pixel regions formed thereon; adhesive frame formed on the semiconductor substrate, the adhesive frame including a peripheral adhesive frame arranged along the periphery of the semiconductor substrate and multiple reaction well adhesive frames disposed within the peripheral adhesive frame; a biological liquid crystal filled at least in each of the reaction well adhesive frames, the biological liquid crystal having an antigen-modified or an antibody-modified liquid crystal sensing interface; a glass coverplate disposed opposite to the semiconductor substrate; and a bonding layer, bonding the adhesive frames to the glass coverplate and loses a bonding power when heated or irradiated by UV light.

15 Claims, 5 Drawing Sheets

(56) References Cited

FOREIGN PATENT DOCUMENTS

| CN | 114609704 | A | 6/2022 |
|----|-----------|---|--------|
| JP | 2006-047709 | A | 2/2006 |
| JP | 2009-134256 | A | 6/2009 |
| KR | 10-2000-0039542 | A | 7/2000 |
| KR | 10-2013-0126322 | A | 11/2013 |
| KR | 10-2013-0126323 | A | 11/2013 |
| KR | 10-1620085 | B1 | 5/2016 |
| WO | 2017/191755 | A1 | 11/2017 |
| WO | 2020/173059 | A1 | 9/2020 |

* cited by examiner

IMAGE SENSOR AND METHOD FOR FABRICATING SAME

CROSS-REFERENCE TO RELATED APPLICATION

This application claims the priority of Chinese patent application number 202210887391.8, filed on Jul. 26, 2022, the entire contents of which are incorporated herein by reference.

TECHNICAL FIELD

The present invention pertains to the field of integrated circuit fabrication technology, and relates in particular to an image sensor and a method for fabricating the image sensor.

BACKGROUND

Liquid crystal is a special state of matter between liquid and solid. Thanks to birefringence, orientational order, electro-optic activity and other unique characteristics of liquid crystal molecules, in addition to the widely use in electronics and electro-optic displays, liquid crystals have also been used as signal conversion elements in the fields of biology and chemistry. Controlling alignment of liquid crystal molecules is one of the current focuses in the development of smart functional materials and devices. The characteristic of liquid crystals responding to an applied electric field has been applied to various display devices. When exposed to an applied electric field, liquid crystal molecules will have their long axes oriented along the electric field direction. However, in the absence of an applied electric field, directional orientation of liquid crystal molecules may be accomplished with a molecule layer that is parallel or perpendicularly oriented, or with another induction layer.

Many biological liquid crystal image sensors using liquid crystal molecules as signal conversion elements have been developed and applied to the detection of various substances such as proteins, antibodies, heavy metal ions, nucleic acids and pesticides. They provide qualitative and quantitative analysis basically by a specific recognition reaction for a substance of interest (e.g., an antigen-antibody reaction) taking place on a sensitive membrane surface, which causes disturbances to the ordered alignment of liquid crystal molecules. Such biological liquid crystal image sensors can provide information about biochemical reactions by color changes in biological liquid crystal cells, and expected to have broad future application in the fields of clinical medicine, food inspection and biological science.

SUMMARY OF THE INVENTION

It is an object of the present invention to provide an image sensor. After heating or UV irradiation, a user can easily strip off a glass coverplate and then apply an antibody or antigen in drops onto the surface of a biological liquid crystal. Subsequently, an image signal may be acquired from the image sensor for back-end analysis.

The present invention provides an image sensor, including:
  a semiconductor substrate with a plurality of pixel regions formed thereon;
  an adhesive frame formed on the semiconductor substrate, wherein the adhesive frame includes a peripheral adhesive frame arranged along the periphery of the semiconductor substrate and a plurality of reaction well adhesive frames disposed within the peripheral adhesive frame;
  a biological liquid crystal filled at least in each reaction well adhesive frame, wherein the biological liquid crystal has an antigen-modified or an antibody-modified liquid crystal sensing interface;
  a glass coverplate disposed opposite to the semiconductor substrate; and
  a bonding layer, configured to bond the adhesive frame to the glass coverplate, wherein the bonding layer loses a bonding power when heated or irradiated by an UV light.

Additionally, the reaction well adhesive frames may include a plurality of first reaction well adhesive frames spaced apart from one another, each first reaction well adhesive frame having a shape of a circular ring.

Additionally, the biological liquid crystal in the first reaction well adhesive frames may have a diameter of 10 μm to 100 μm.

Additionally, the reaction well adhesive frames may include a plurality of second reaction well adhesive frames, wherein the second reaction well adhesive frames are connected to one another, each second reaction well adhesive frame having a shape of an N-sided polygonal ring.

Additionally, the biological liquid crystal may include a liquid crystal layer and an antibody layer or an antigen layer lying on a surface of the liquid crystal layer.

Additionally, the antibody layer may comprise carboxyl groups (—COOH) and may be chemically modified so as to be chemically bonded to the liquid crystal layer.

Additionally, a microlens array and a flat layer may be formed above the semiconductor substrate, wherein the flat layer covers the microlens array, wherein the biological liquid crystal and the reaction well adhesive frames are formed on a surface of the flat layer, and wherein the flat layer has a refractive index ranging from 1.2-1.5.

Additionally, color filter units may be formed between the semiconductor substrate and the microlens array, wherein the color filter units include red filter units, green filter units and blue filter units.

Additionally, the image sensor may further include a first polarizer layer that is embedded in the flat layer and is located above the microlens array.

Additionally, monochromatic pixel units may be formed between the semiconductor substrate and the microlens array, wherein the image sensor further includes a second polarizer layer disposed in the monochromatic pixel units.

Additionally, a first electrode may be disposed around the periphery of a surface of the semiconductor substrate facing the glass coverplate.

Additionally, the image sensor may further include a first insulating layer, a first redistribution metal layer and solder balls, wherein the first insulating layer covers a surface of the semiconductor substrate away from the glass coverplate and coves sidewalls thereof, wherein the first redistribution metal layer extends over the sidewalls of the first insulating layer and terminates on upper and lower surfaces thereof, wherein the first redistribution metal layer leads the first electrode to a surface of the first insulating layer away from the semiconductor substrate, wherein the first redistribution metal layer further includes first bonding pads spaced apart from one another, wherein the solder balls are formed on surfaces of the first bonding pads.

Additionally, the image sensor may further include a second insulating layer, a second redistribution metal layer and solder balls, wherein the semiconductor substrate has vias formed therein, and wherein the second insulating layer covers sidewalls of the vias and the surface of the semiconductor substrate away from the glass coverplate, wherein the second redistribution metal layer leads the first electrode to a surface of the second insulating layer through the vias, and wherein the second redistribution metal layer further includes second bonding pads spaced apart from one another, wherein the solder balls are formed on the second bonding pads.

The present invention provides a method for fabricating an image sensor, including:

providing a semiconductor substrate with a plurality of pixel regions formed thereon;

forming an adhesive frame on the semiconductor substrate, wherein the adhesive frame includes a peripheral adhesive frame arranged along the periphery of the semiconductor substrate and a plurality of reaction well adhesive frames disposed within the peripheral adhesive frame;

filling a biological liquid crystal at least in each reaction well adhesive frame, wherein the biological liquid crystal has an antigen-modified or an antibody-modified liquid crystal sensing interface;

providing a glass coverplate disposed opposite to the semiconductor substrate; and bonding the adhesive frame to the glass coverplate by a bonding layer, wherein the bonding layer loses a bonding power when heated or irradiated by UV light.

Additionally, the adhesive frames may be formed by a photolithography process, or by a screen printing process.

Compared with the prior art, the present invention provides the following benefits:

The present invention provides an image sensor and method for fabricating the image sensor. The image sensor includes: a semiconductor substrate with a number of pixel regions formed thereon; an adhesive frame formed on the semiconductor substrate, the adhesive frame including a peripheral adhesive frame arranged along the periphery of the semiconductor substrate and a number of reaction well adhesive frames disposed within the peripheral adhesive frame; a biological liquid crystal filled at least in each reaction well adhesive frame, the biological liquid crystal having an antigen- or an antibody-modified liquid crystal sensing interface; a glass coverplate disposed opposite to the semiconductor substrate; and a bonding layer, which bonds the adhesive frames to the glass coverplate and loses a bonding power when heated or irradiated by UV light. The image sensor of the present invention combines the specificity of immune response, liquid crystal alignment technology and image processing technology. After said heating or UV irradiation, a user can easily strip off the glass coverplate and then apply an antibody or antigen in drops onto the surface of the biological liquid crystal. Subsequently, an image signal may be acquired from the image sensor for back-end analysis.

DESCRIPTION OF REFERENCE NUMERALS IN DRAWINGS

Figure 1:
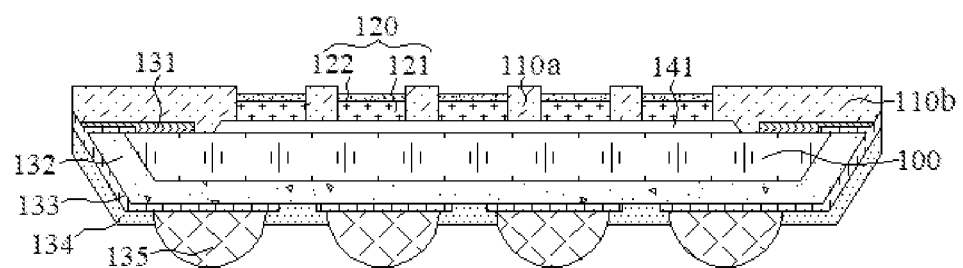
FIG. 1 is a schematic diagram showing an image sensor after adhesive frames are formed according to an embodiment of the present invention.

100: Semiconductor Substrate; 110: Adhesive Frame; 110a: First Reaction Well Adhesive Frame; 110b: Peripheral Adhesive Frame; 110c: Second Reaction Well Adhesive Frame; 120: Biological Liquid Crystal; 121: Liquid Crystal Layer; 122: Antibody Layer; 131: First Electrode; 132: First Insulating Layer; 133: First Redistribution Metal Layer; 133a: First Bonding Pad; 134: First Passivation Layer; 135: Solder Ball;

102: Semiconductor Substrate; 136: Second Insulating Layer; 137: Second Redistribution Metal Layer; 137a: Second Bonding Pad; 138: Second Passivation Layer; 141: Flat Layer; 142: Microlens Array; 143: Color Filter Unit; 143a: Blue Filter Unit; 143b: Green Filter Unit; 143c: Red Filter Unit; 144: First Polarizer Layer; 145: Second Polarizer Layer; 146: Monochromatic Pixel Unit; 150: Third Bonding Pad;

160: Circuit Board; 143: Fourth Bonding Pad; 162: Connector; 200: Glass Coverplate; 300: Bonding Layer.

DETAILED DESCRIPTION

In view of the foregoing description, embodiments of the present invention provide an image sensor. The present invention will be described in greater detail below with reference to particular embodiments and the accompanying drawings. Advantages and features of the present invention will become more apparent from the following description. Note that the figures are provided in a very simplified form not necessarily drawn to exact scale and for the only purpose of facilitating easy and clear description of the embodiments.

For ease of description, relative spatial terms such as "above", "under", "upper" and "lower" may be used in the description of some embodiments disclosed herein to describe how one element or component is related to another element or component, or to other elements or components, as in the accompanying drawings illustrating the embodiments. It is to be understood that, apart from those shown, such relative spatial terms are also intended to describe various orientations that can be assumed in use or operation of the device shown. For example, if the device is turned upside down, then an element or component described as being "under" or "below" another element or component should now be described as being "above" or "on top of" the other element or component. As used hereinafter, the terms "first", "second" and the like may be used to distinguish between similar elements without necessarily implying any particular ordinal or chronological sequence. It is to be understood that the terms so used are interchangeable, whenever appropriate.

An embodiment of the present invention provides an image sensor, including:

semiconductor substrate with a number of pixel regions formed thereon;

adhesive frames formed on the semiconductor substrate, the adhesive frames including a peripheral adhesive frame arranged along the periphery of the semiconductor substrate and a number of reaction well adhesive frames disposed within the peripheral adhesive frame;

a biological liquid crystal filled at least in each of the reaction well adhesive frames, the biological liquid crystal having an antigen- or an antibody-modified liquid crystal sensing interface;

a glass coverplate disposed opposite to the semiconductor substrate; and bonding layer, which bonds the adhesive frames to the glass coverplate and will lose its bonding power when heated or irradiated by ultraviolet (UV) light.

An image sensor according to an embodiment of the present invention will be described in detail below with reference to FIGS. 1 to 9.

Referring to FIGS. 1 to 5, the image sensor includes a semiconductor substrate 100, adhesive frames 110, biological liquid crystal 120, a glass coverplate 200 and a bonding layer 300. Specifically, the semiconductor substrate 100 may be fabricated from any suitable semiconductor material for semiconductor devices (e.g., Si, SiC, SiGe or the like). A pixel array comprising a plurality of pixels arranged into multiple columns and multiple rows is formed on the side of the semiconductor substrate 100 facing the glass coverplate 200. Specifically, a number of display units are formed on the semiconductor substrate 100, and the display unit comprises the pixel array. Each display unit may include a plurality of scan lines, a plurality of data lines and a plurality of active devices (e.g., thin-film transistors) electrically connected to pixel electrodes in the pixel array. Sequentially formed on the surface of the semiconductor substrate 100 may be color filter units 143, a microlens array 142 and a flat layer 141. Incident light travels through the microlens array 142 and the filter elements 143 and then reaches the pixels.

The adhesive frames 110 are formed on the semiconductor substrate 100 and include a peripheral adhesive frame 110b arranged along the periphery of the semiconductor substrate 100 and a number of first reaction well adhesive frames 110a disposed within the peripheral adhesive frame 110b. As an example, the first reaction well adhesive frames 110a are spaced circular rings. The first reaction well adhesive frames 110a may be formed on a surface of the flat layer 141. The peripheral adhesive frame 110b is, for example, a rectangular annulus. An inner annular portion of the peripheral adhesive frame 110b can cover a small portion of the flat layer 141. The adhesive frames 110 may be formed by photolithography, or by screen printing. Third bonding pads 150 for picking up signals from the image sensor may be disposed on a region of the semiconductor substrate 100 at the outer side of the peripheral adhesive frame 110b.

The biological liquid crystal 120 may include a liquid crystal layer 121 and an antibody 122 or antigen layer located on a surface of the liquid crystal layer 121. The liquid crystal layer 121 may be, for example, a layer of molecules of the typical CH3(CH2)4C6H4C6H4CN ("5CB", for short) with biphenyl rings. The 5CB molecules are rod-like liquid crystal molecules with a length of about 2 nm, a width of about 0.5 nm and unique optical anisotropy. Such rod-like liquid crystal molecules can be used for liquid crystal displays thanks to their calamitic nature, which allows for them to exhibit different indices of refraction for the light traveling in a direction along their long axes and for the light traveling in a direction perpendicular to their long axes. Such anisotropic liquid crystal refractivity may cause birefringence of incident light, as well as changes in the state and direction of polarization of incident polarized light.

As an example, the liquid crystal (e.g., 5CB) layer 121 may be first formed by dropwise inkjet dispensing within the first reaction well adhesive frames 110a and between adjacent first reaction well adhesive frames 110a, and the antibody layer 122 may be then formed on the surface of the liquid crystal layer 121 also by dropwise inkjet dispensing. With polarized light microscopy under conoscopic illumination, a Maltese cross can be observed in a dark field of view. The liquid crystal (e.g., 5CB) layer 121 in the liquid crystal cells is perpendicularly aligned. The biological liquid crystal 120 may further include N, N-dimethyl-N-octadecyl-3-aminopropyltrimethoxysilane (DMOAP), which can effectively induce perpendicular alignment of liquid crystal molecules in the liquid crystal (e.g., 5CB) layer 121. An image sensor with such a liquid crystal sensing layer can be used in the field of biomedicine to provide the best optical adaptation.

When functionally modified with an antibody, the biological liquid crystal 120 may be sensitive only to a predetermined antigen. Alternatively, when functionally modified with an antigen, the biological liquid crystal 120 may be sensitive only to a predetermined antibody. Binding of the antibody and the antigen is bound to disturb liquid crystal molecules in the liquid crystal (e.g., 5CB) layer 121, causing changes in light refraction. Detecting light signals from liquid crystals with polarized light microscopy is a technique with scalable sensitivity and forms an important part of biomedical detection.

The analysis and detection of immune substances (e.g., antibodies and antigens) are of great significance for clinical diagnosis and basic medical research. Specific labeling of antigens and antibodies is crucial to immunological detection. Liquid crystal is the fourth state of matter. Liquid crystal molecules possess an orientational order (therefore liquid crystals have optical anisotropy) but lack a positional order (therefore liquid crystals have fluidity). Because of this intermediate state of matter, liquid crystals possess properties between solid crystals and isotropic liquids. Moreover, since liquid crystal materials exhibit properties of both liquids and crystals, they are extremely sensitive to physical, chemical and biological stimuli (i.e., liquid crystal molecules are prone to orientational variation and further disorder when exposed to such stimuli) and able to amplify optical signals (as they are more prone to variation in optical parameters such as refractivity when contrasted with crystals). These make them very suitable for the detection of biomolecules. Depending on their alignment, liquid crystal molecules are categorized into the following three major types: smectic, nematic and cholesteric phases. In the smectic phase, rod-like molecules are parallel aligned along their long axes, arranged into layers and can only rotate or slide within the layers without inter-layer movement. In the nematic phase, rod-like molecules are parallel aligned along their long axes while having a staggered arrangement and can rotate and vertically move. As nematic-phase liquid crystals have good fluidity, they are the main type used in displays.

The present invention provides an image sensor combining the specificity of immune response, liquid crystal alignment technology and image processing technology. Antigens may include, for example, bacteria, molds and viruses. An antibody may have a special chemical compositional structure, which has memory properties and enables the antibody to readily capture a corresponding antigen. The antibody in the antibody layer 122 is generally terminated by carboxyl groups (—COOH) and may be chemical modified so as to be able to be chemically bonded to the liquid crystal (e.g., 5CB) layer 121, resulting in bonding of the antibody layer 122 to the liquid crystal layer 121.

The antibody layer 122 may be applied onto the liquid crystal layer 121 by dropwise inkjet dispensing. The liquid crystal (e.g., 5CB) layer 121 is perpendicularly aligned in the liquid crystal cells (in the first reaction well adhesive frames 110a). This alignment disallows orthogonally polarized light to pass through the liquid crystal cells. As a result, a completely black image will be captured at the light exit. When the antibody in the antibody layer 122 undergoes an immune reaction with a foreign antigen, the uniform alignment of the liquid crystal molecules will experience changes (leading to orientational disorder of some liquid crystal molecules). As a result, polarized light may transmit through the orientation-altered regions in the liquid crystal cell, and an image with bright spots may be captured at the light exit. The size and amount of the bright spots represent transmittance of the polarized light that is positively correlated with a concentration of the antigen. The transmittance of the polarized light may be characterized by a weighted average of grey values of the image, enabling quantitative analysis of the concentration of the antigen.

As specific antigen/antibody binding will cause orientational changes of the liquid crystal layer in the image sensor, a transition from "dark" to "bright" can be photographically observed at the liquid crystal layer in the first reaction well adhesive frames 110a. With this, antigen or antibody detection is made possible. During such detection, a sample under test may be added onto the biological liquid crystal 120 in the first reaction well frames, and an image may be captured under illumination of orthogonally polarized light. These measurement steps are simple, and the biological liquid crystal 120 can provide a unique optical amplification effect and high response sensitivity. Moreover, quantitative determination of a concentration of a substance of interest can be achieved using a weighted average of grey values of the image, without involving the use of additional optical detection equipment.

The biological liquid crystal 120 is filled at least in each of the first reaction well adhesive frames 110a and has an antigen- or an antibody-modified liquid crystal sensing interface. The biological liquid crystal in each first reaction well adhesive frame 110a forms one liquid crystal reaction well, which acts as a detection unit. The biological liquid crystal in a number of the first reaction well adhesive frames 110a forms a liquid crystal reaction well array. The first reaction well adhesive frames 110a divide the biological liquid crystal 120 into a number of reaction wells.

Figure 2:
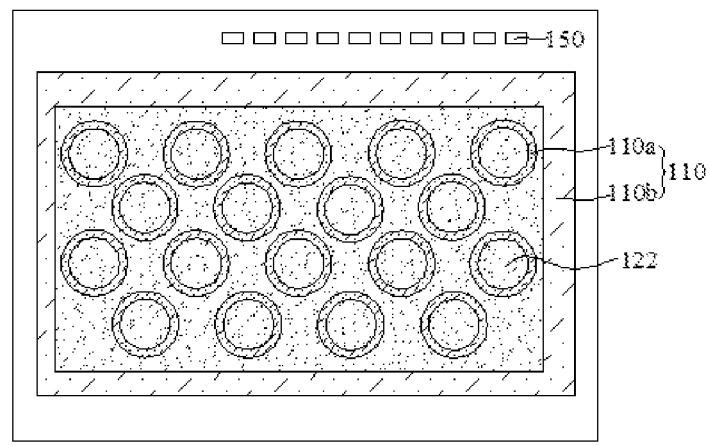
FIG. 2 is a top view of a first example of an image sensor according to an embodiment of the present invention.
Figure 3:
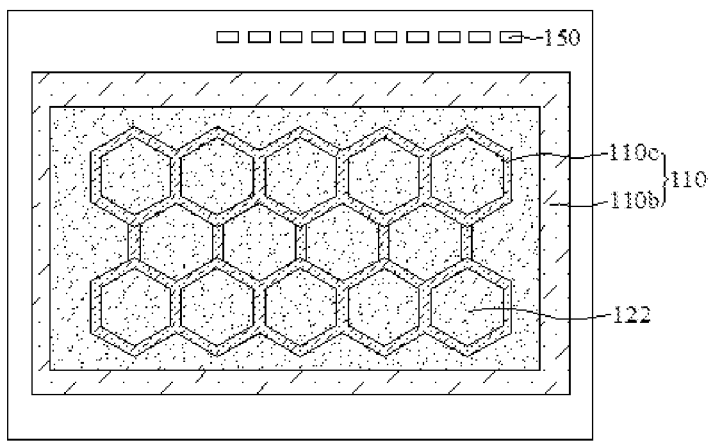
FIG. 3 is a top view of a second example of the image sensor according to an embodiment of the present invention.

The image sensor includes a number of such liquid crystal reaction wells, which have a diameter of about 10 μm to 100 μm. The reaction well array may have a circular or honeycomb shape. As shown in FIG. 2, in one example, the liquid crystal reaction well array may include a number of spaced circular liquid crystal reaction wells, and the first reaction well adhesive frames 110a may be in the shape of circular rings. As shown in FIG. 3, in another example, the liquid crystal reaction well array may include a number of N-sided polygonal liquid crystal reaction wells, which are joined together to form a honeycomb-like shape and are encircled by respective second reaction well adhesive frames 110c implemented as N-sided polygonal rings. N may be, for example, any of 4, 5, 6 or 8.

The image sensor further includes a glass coverplate 200 and a bonding layer 300. The glass coverplate 200 is disposed in opposition to the semiconductor substrate 100. The bonding layer 300 bonds the adhesive frames 110 to the glass coverplate 200. A top surface of the biological liquid crystal 120 in the first reaction well adhesive frames 110a may be lower than a top surface of the peripheral adhesive frame 110b, in order to avoid the top surface of the biological liquid crystal 120 in the first reaction well adhesive frames 110a from being bonded to the bonding layer 300. This can prevent the biological liquid crystal 120 from being partially removed or otherwise affected by the bonding layer 300 during the subsequent removal of the glass coverplate 200 from the adhesive frame 110.

On the side of the semiconductor substrate 100 facing the glass coverplate 200, a first electrode 131 is disposed along the periphery in order to pick up electrical signals and feed them to peripheral devices electrically connected thereto. The peripheral adhesive frame 110b may cover the first electrode 131.

In one embodiment, the image sensor further includes a first insulating layer 132, a first redistribution metal layer 133, a first passivation layer 134 and solder balls 135. The first insulating layer 132 covers a surface of the semiconductor substrate 100 away from the glass coverplate 200 and sidewalls thereof. The first redistribution metal layer 133 extends over sidewalls of the first insulating layer 132 and terminates on upper and lower surfaces thereof. The first redistribution metal layer 133 leads the first electrode 131 to the surface of the first insulating layer 132 which is away from the semiconductor substrate 100. The first redistribution metal layer 133 further includes spaced first bonding pads 133a disposed on the surface of the semiconductor substrate 100 away from the first insulating layer 132. A cross-section of the semiconductor substrate 100 perpendicular to the top and bottom surfaces thereof may have an inverted trapezoidal or rectangular shape. The first passivation layer 134 covers the first redistribution metal layer 133, with the solder balls 135 being exposed from the first passivation layer 134.

The bonding layer 300 will lose its bonding power when irradiated by UV light or heated (e.g., at an instantaneous high temperature created by laser irradiation) after the product fabrication process has been completed. The irradiation or heating may occur mainly to the bonding layer 300 between the peripheral adhesive frame 110b and the glass coverplate 200 to such extent that the glass coverplate 200 can be lifted from the adhesive frames 110. It is to be noted that the heating after the product fabrication process has been completed should be conducted at a temperature lower than the melting point of the solder balls 135.

Figure 6:
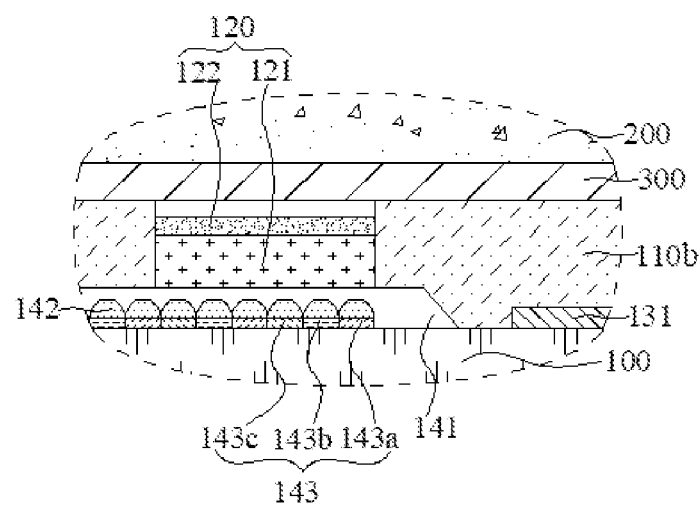
FIG. 6 is a schematic diagram showing an image sensor not including a polarizer layer according to an embodiment of the present invention.
Figure 7:
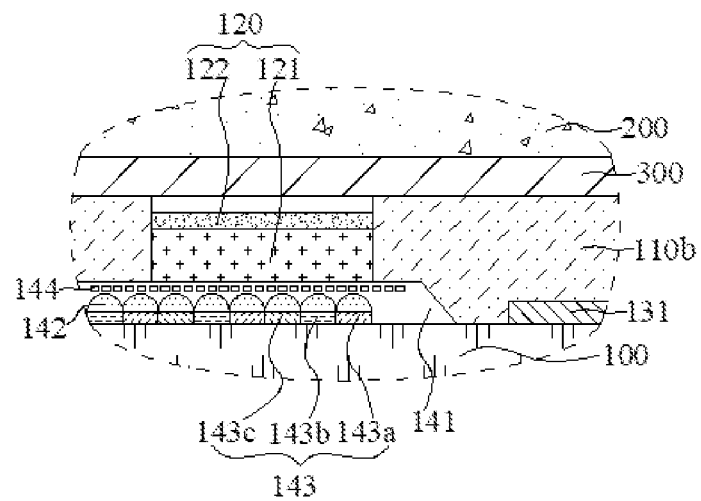
FIG. 7 is a schematic diagram showing an image sensor including a first polarizer layer according to an embodiment of the present invention.
Figure 8:
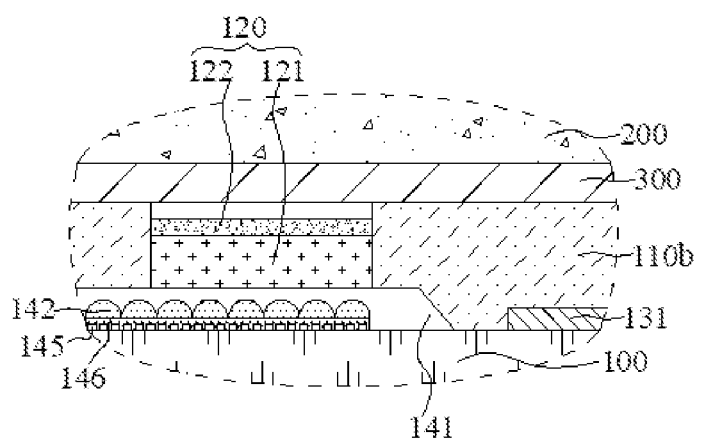
FIG. 8 is a schematic diagram showing an image sensor including a second polarizer layer according to an embodiment of the present invention.

FIG. 6 shows an embodiment where the image sensor does not include a polarizer layer. However, the image sensor may further include a polarizer layer. In one example with the color filter units 143, the microlens array 142 and the flat layer 141 being sequentially formed on the surface of the semiconductor substrate 100, as shown in FIG. 7, a first polarizer layer 144 is embedded in the flat layer 141 and is located above the microlens array 142 which is located above the color filter units 143. In another example, as shown in FIG. 8, monochromatic pixel units 146 are disposed on the surface of the semiconductor substrate 100, and there is no need to arrange the filter elements for monochromatic pixel units 146. A second polarizer layer 145 is disposed within the monochromatic pixel units 146 and is located between the surface of the semiconductor substrate 100 and the microlens array 142. The flat layer 141 covers the microlens array 142, in order to provide a flatter surface compared to the wavy surface of the microlens array 142, which can facilitate the formation of the biological liquid crystal 120. The flat layer 141 may have a refractive index n of, for example, from 1.2 to 1.5, which is helpful in achieving better matched optical performance.

Figure 4:
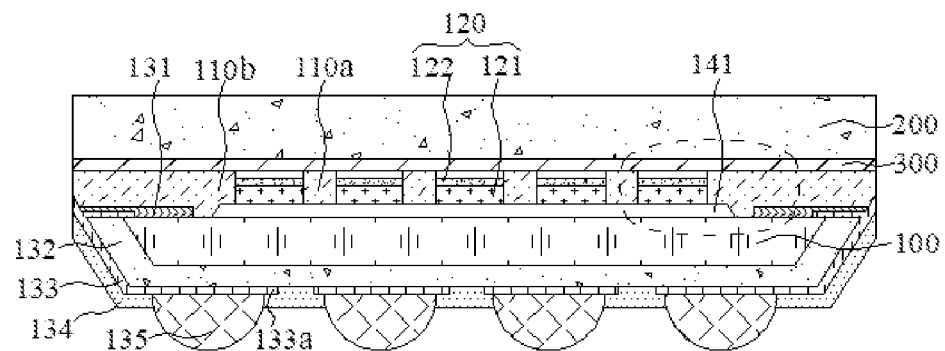
FIG. 4 is a schematic diagram showing an image sensor after a glass coverplate is formed according to an embodiment of the present invention.
Figure 5:
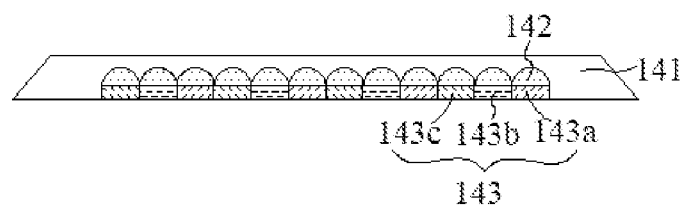
FIG. 5 is a schematic diagram showing the internal structure of a flat layer in an image sensor according to an embodiment of the present invention.
Figure 9:
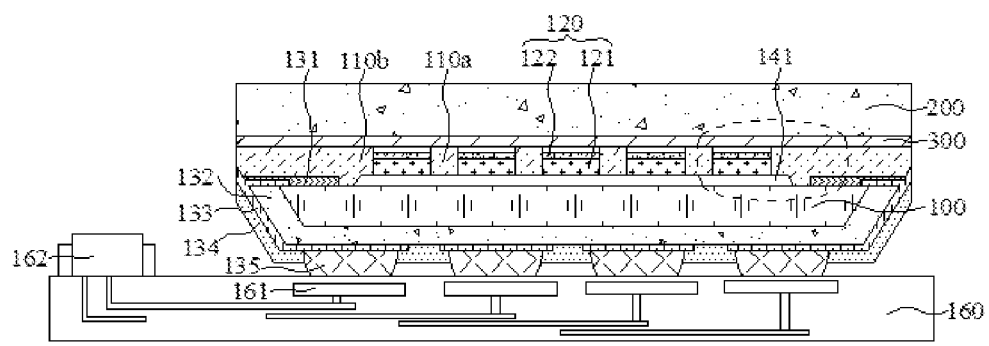
FIG. 9 is a schematic diagram showing a structure for feeding signals to a circuit board in an image sensor according to an embodiment of the present invention.

The image sensor schematically shown in FIG. 4 may be one of individual image sensor dies obtained by dicing (cutting) an image sensor wafer. That is, image sensor dies are fabricated at the wafer level and then singulated by a dicing process. As shown in FIG. 9, the individual image sensor die may be processed as required to enable pickup of signals therefrom. For example, the image sensor may be welded onto a circuit board 160 in such a manner that the solder balls 135 in the image sensor are electrically connected to respective fourth bonding pads 161 on the circuit board 160. Signals from the fourth bonding pads 161 may be transmitted over metal traces in the circuit board 160 to pins in a connector 162. For example, input signals (positive and negative power voltages) and output signals (positive and negative output voltages) of the image sensor may be fed to the pins in the connector 162.

Figure 10:
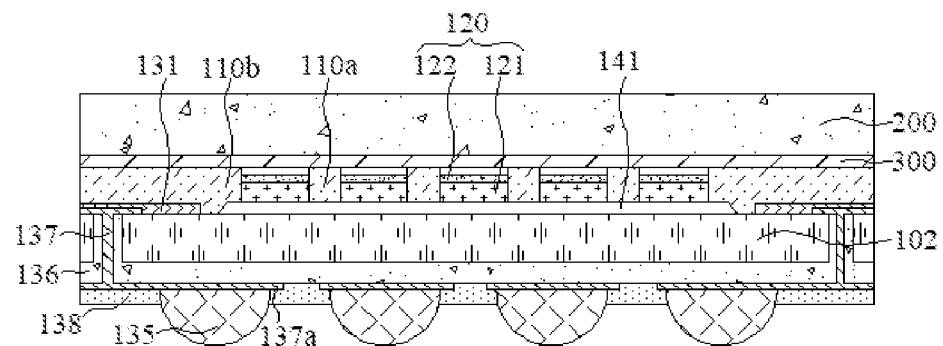
FIG. 10 is a schematic diagram showing an image sensor according to another embodiment of the present invention.

In another embodiment, as shown in FIG. 10, the image sensor further includes a second insulating layer 136, a second redistribution metal layer 137, a second passivation layer 138 and solder balls 135. Vias may be formed in the semiconductor substrate 102 optionally under the peripheral adhesive frame 110b. The vias extend through the semiconductor substrate 102, and the second insulating layer 136 extends over sidewalls of the vias and the surface of the semiconductor substrate 102 away from the glass coverplate 200. The second redistribution metal layer 137 includes via electrodes and spaced second bonding pads 137a. The via electrodes lead the first electrode 131 to a surface of the second insulating layer 136 away from the semiconductor substrate 102. The via electrodes are formed by filling up the cavities in the second insulating layer 136 and extend to a top surface of the semiconductor substrate 102 and a bottom surface of the second insulating layer 136. The spaced second bonding pads 137a are disposed on the surface of the second insulating layer 136 away from the semiconductor substrate 102. The solder balls 135 may be formed on surfaces of the second bonding pads 137a. A cross-section of the semiconductor substrate 100 perpendicular to the top and bottom surfaces thereof may have an inverted trapezoidal or rectangular shape.

Figure 11:
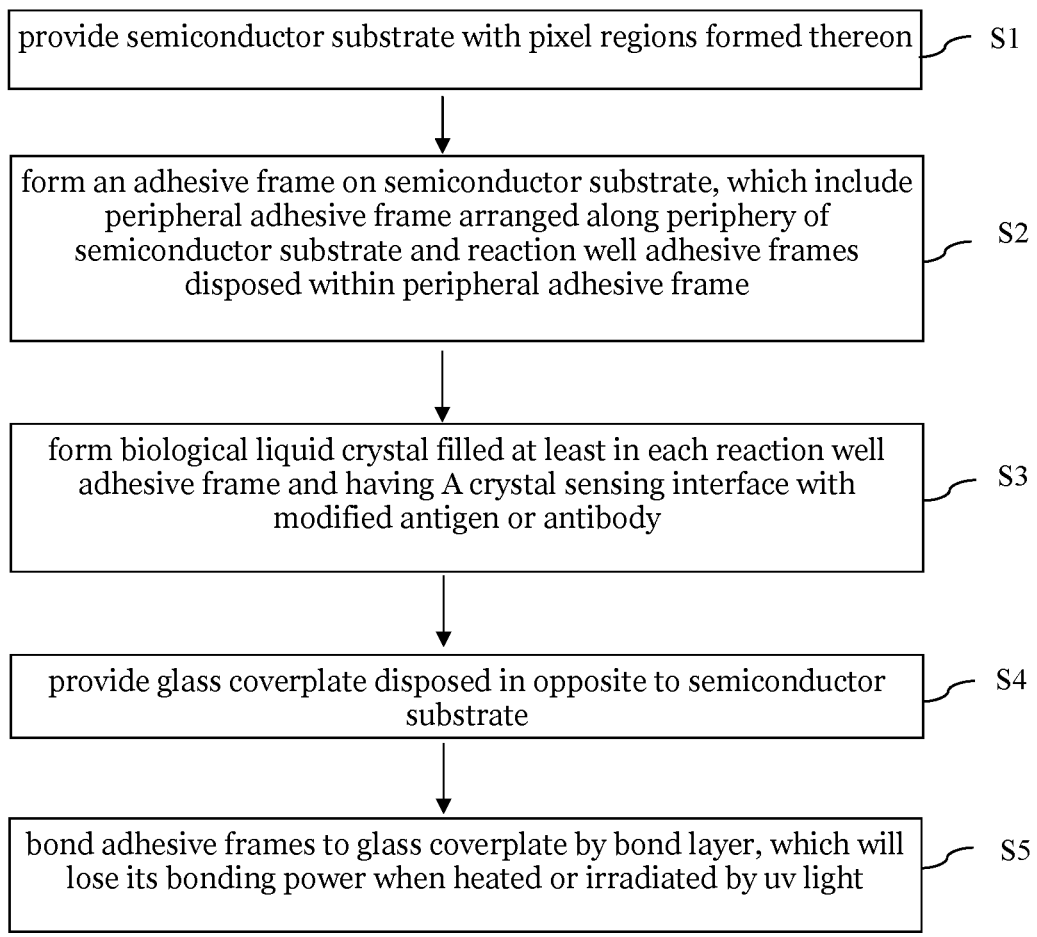
FIG. 11 is a flowchart of a method for fabricating an image sensor according to another embodiment of the present invention.

The present invention also provides a method for fabricating an image sensor, which, as shown in FIG. 11, includes:
  in step S1, providing a semiconductor substrate with a number of pixel regions formed thereon;
  in step S2, forming adhesive frames on the semiconductor substrate, the adhesive frames including a peripheral adhesive frame arranged along the periphery of the semiconductor substrate and a number of reaction well adhesive frames disposed within the peripheral adhesive frame;
  in step S3, forming a biological liquid crystal filled at least in each of the reaction well adhesive frames, the biological liquid crystal having an antigen- or an antibody-modified liquid crystal sensing interface;
  in step S4, providing a glass coverplate disposed opposite to the semiconductor substrate; and
  in step S5, bonding the adhesive frames to the glass coverplate by a bonding layer, which will lose its bonding power when heated or irradiated by UV light.

The adhesive frames may be formed by photolithography or screen printing. The bonding layer 300 will lose its bonding power when irradiated by UV light or heated (e.g., at an instantaneous high temperature created by laser irradiation) after the product fabrication process has been completed, enabling the glass coverplate 200 to be removed from the adhesive frames 110. It is to be noted that the heating after the product fabrication process has been completed should be conducted at a temperature lower than the melting point of the solder balls 135. After such heating or UV irradiation, a user can easily strip off the glass coverplate 200 and then apply an antibody or antigen in drops onto the surface of the biological liquid crystal 120. Subsequently, an image signal may be acquired from the image sensor for back-end analysis.

In summary, the present invention provides an image sensor and method for fabricating the image sensor. The image sensor includes: a semiconductor substrate with a number of pixel regions formed thereon; adhesive frames formed on the semiconductor substrate, the adhesive frames including a peripheral adhesive frame arranged along the periphery of the semiconductor substrate and a number of reaction well adhesive frames disposed within the peripheral adhesive frame; a biological liquid crystal filled at least in each of the reaction well adhesive frames, the biological liquid crystal having an antigen- or antibody-modified liquid crystal sensing interface; a glass coverplate disposed opposite to the semiconductor substrate; and a bonding layer, which bonds the adhesive frames to the glass coverplate and will lose its bonding power when heated or irradiated by UV light. The present invention combines the specificity of immune response, liquid crystal alignment technology and image processing technology. After said heating or UV irradiation, a user can easily strip off the glass coverplate and then apply an antibody or antigen in drops onto the surface of the biological liquid crystal. Subsequently, an image signal may be acquired from the image sensor for back-end analysis.

The embodiments disclosed herein are described in a progressive manner, with the description of each embodiment focusing on its differences from others. Reference can be made between the embodiments for their identical or similar parts. Since the method embodiments correspond to the device embodiments, they are described relatively briefly, and reference can be made to the device embodiments for details of them.

The foregoing description is merely that of several preferred embodiments of the present invention and is not intended to limit the scope of the claims of the invention in any way. Any person of skill in the art may make various possible variations and changes to the disclosed embodiments in light of the methodologies and teachings disclosed hereinabove, without departing from the spirit and scope of the invention. Accordingly, any and all such simple variations, equivalent alternatives and modifications made to the foregoing embodiments based on the essence of the present invention without departing from the scope of the embodiments are intended to fall within the scope of protection of the invention.

What is claimed is:

1. An image sensor, comprising:
a semiconductor substrate with a plurality of pixel regions formed thereon;
an adhesive frame formed on the semiconductor substrate, wherein the adhesive frame includes a peripheral adhesive frame arranged along a periphery of the semiconductor substrate and a plurality of reaction well adhesive frames disposed within the peripheral adhesive frame;
a biological liquid crystal filled at least in each reaction well adhesive frame, wherein the biological liquid crystal has an antigen-modified or an antibody-modified liquid crystal sensing interface;
a glass coverplate disposed opposite to the semiconductor substrate; and
a bonding layer, configured to bond the adhesive frame to the glass coverplate, wherein the bonding layer loses a bonding power when heated or irradiated by an ultraviolet light.

2. The image sensor of claim 1, wherein the reaction well adhesive frames include a plurality of first reaction well adhesive frames spaced apart from one another, each first reaction well adhesive frame having a shape of a circular ring.

3. The image sensor of claim 2, wherein the biological liquid crystal in the first reaction well adhesive frame has a diameter of 10 μm to 100 μm.

4. The image sensor of claim 1, wherein the reaction well adhesive frames include a plurality of second reaction well adhesive frames, wherein the second reaction well adhesive frames are connected to one another, each second reaction well adhesive frame having a shape of an N-sided polygonal ring.

5. The image sensor of claim 1, wherein the biological liquid crystal comprises a liquid crystal layer and an antibody layer or an antigen layer lying on a surface of the liquid crystal layer.

6. The image sensor of claim 5, wherein the antibody layer comprises carboxyl groups (—COOH) and is chemically modified so as to be chemically bonded to the liquid crystal layer.

7. The image sensor of claim 1, wherein a microlens array and a flat layer are formed above the semiconductor substrate, wherein the flat layer covers the microlens array, wherein the biological liquid crystal and the reaction well adhesive frames are formed on a surface of the flat layer, and wherein the flat layer has a refractive index ranging from 1.2-1.5.

8. The image sensor of claim 7, wherein color filter units are formed between the semiconductor substrate and the microlens array, wherein the color filter units include red filter units, green filter units and blue filter units.

9. The image sensor of claim 8, further comprising a first polarizer layer that is embedded in the flat layer and is located above the microlens array.

10. The image sensor of claim 7, wherein monochromatic pixel units are formed between the semiconductor substrate and the microlens array, and wherein the image sensor further comprises a second polarizer layer disposed in the monochromatic pixel units.

11. The image sensor of claim 1, wherein a first electrode is disposed around the periphery of a surface of the semiconductor substrate facing the glass coverplate.

12. The image sensor of claim 11, further comprising a first insulating layer, a first redistribution metal layer and solder balls,
wherein the first insulating layer covers a surface of the semiconductor substrate away from the glass coverplate and covers sidewalls of the semiconductor substrate,
wherein the first redistribution metal layer extends over sidewalls of the first insulating layer and terminates on an upper surface and a lower surface thereof, wherein the first redistribution metal layer leads the first electrode to a surface of the first insulating layer away from the semiconductor substrate,
wherein the first redistribution metal layer further comprises first bonding pads spaced apart from one another, wherein the solder balls are formed on surfaces of the first bonding pads.

13. The image sensor of claim 11, further comprising a second insulating layer, a second redistribution metal layer and solder balls,
wherein the semiconductor substrate has vias formed therein, and wherein the second insulating layer covers sidewalls of the vias and the surface of the semiconductor substrate away from the glass coverplate,
wherein the second redistribution metal layer leads the first electrode to a surface of the second insulating layer through the vias,
wherein the second redistribution metal layer further comprises second bonding pads spaced apart from one another, wherein the solder balls are formed on the second bonding pads.

14. A method for fabricating an image sensor, comprising:
providing a semiconductor substrate with a plurality of pixel regions formed thereon;
forming an adhesive frame on the semiconductor substrate, wherein the adhesive frame includes a peripheral adhesive frame arranged along a periphery of the semiconductor substrate and a plurality of reaction well adhesive frames disposed within the peripheral adhesive frame;
filling a biological liquid crystal at least in each reaction well adhesive frame, wherein the biological liquid crystal has an antigen-modified or an antibody-modified liquid crystal sensing interface;
providing a glass coverplate disposed opposite to the semiconductor substrate; and
bonding the adhesive frame to the glass coverplate by a bonding layer, wherein the bonding layer loses a bonding power when heated or irradiated by ultraviolet light.

15. The method of claim 14, wherein the adhesive frame is formed by a photolithography process, or by a screen printing process.

* * * * *